(12) United States Patent
Lee et al.

(10) Patent No.: US 10,819,322 B2
(45) Date of Patent: Oct. 27, 2020

(54) FREQUENCY DOUBLING APPARATUS AND METHOD THEREOF

(71) Applicant: Realtek Semiconductor Corporation, Hsinchu (TW)

(72) Inventors: An-Ming Lee, Hsinchu County (TW); Chia-Liang Lin, Fremont, CA (US); Yo-Hao Tu, New Taipei (TW); Yu-Hsiang Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/744,470

(22) Filed: Jan. 16, 2020

(65) Prior Publication Data

US 2020/0235725 A1 Jul. 23, 2020

(30) Foreign Application Priority Data

Jan. 17, 2019 (TW) .............................. 108101875 A

(51) Int. Cl.
| | |
|---|---|
| *H03B 19/00* | (2006.01) |
| *H03K 5/00* | (2006.01) |
| *H03K 7/08* | (2006.01) |
| *H03K 3/037* | (2006.01) |
| *G06F 1/06* | (2006.01) |
| *H03K 5/24* | (2006.01) |

(52) U.S. Cl.
CPC ........... *H03K 5/00006* (2013.01); *G06F 1/06* (2013.01); *H03K 3/037* (2013.01); *H03K 5/24* (2013.01); *H03K 7/08* (2013.01); *H03K 2005/00019* (2013.01)

(58) Field of Classification Search
CPC .... H03K 5/00006; H03K 5/1565; H03K 5/24; H03K 3/017; H03K 3/037; H03K 7/08; H03K 2005/00019; H03B 19/00; H03B 19/10; H03B 19/14; H03L 7/0814; G06F 7/68; G06F 1/06
See application file for complete search history.

(56) References Cited

U.S. PATENT DOCUMENTS 10,224,936 B1 * 3/2019 Lin .......................... H03L 7/22
2013/0300481 A1 * 11/2013 Bulzacchelli .......... H03K 3/017
327/175

* cited by examiner

*Primary Examiner* — Long Nguyen
(74) *Attorney, Agent, or Firm* — Locke Lord LLP; Tim Tingkang Xia, Esq.

(57) ABSTRACT

An apparatus is provided that includes a frequency doubler circuit and a duty cycle adjusting circuit. The frequency doubler circuit includes a multiplexer, a variable delay circuit and a divide-by-2 circuit. The multiplexer selects one of a first and a second clock signals having opposite phases according to a selection signal to generate a frequency doubled clock signal. The variable delay circuit delays the frequency doubled clock signal. The divide-by-2 circuit divides a frequency of the frequency doubled clock signal to generate the selection signal. The duty cycle adjusting circuit includes an average voltage generation circuit and a comparison circuit. The average voltage generation circuit generates an average voltage value of the frequency doubled clock signal. The comparison circuit generates a control signal according to a comparison result of the average voltage value and a reference voltage to control the duty cycle of the frequency doubled clock signal.

11 Claims, 4 Drawing Sheets

FREQUENCY DOUBLING APPARATUS AND METHOD THEREOF

RELATED APPLICATIONS

This application claims priority to Taiwan Application Serial Number 108101875, filed Jan. 17, 2019, which is herein incorporated by reference.

BACKGROUND

Field of Invention

The present invention relates to a frequency doubling technology. More particularly, the present invention relates to a frequency doubling apparatus and a frequency doubling method.

Description of Related Art

In general, a frequency doubling apparatus can be implemented by a phase lock loop (PLL) device. Though such a method can generate a clock signal having a doubled frequency accurately, there can be a tiny difference between the transient time and the ideal time called jitter. In order to make the jitter of the clock signal generated by the phase lock loop device smaller, a power source having lower noise or an increasing of the power dissipation can be used to lower the noise generated by the phase lock loop itself. As a result, a higher cost, a higher power dissipation or both of higher cost and power dissipation are required in such application.

Accordingly, what is needed is a frequency doubling apparatus and a frequency doubling method to address the issues mentioned above.

SUMMARY

An aspect of the present invention is to provide an apparatus that includes a frequency doubler circuit and a duty cycle adjusting circuit. The frequency doubler circuit includes a multiplexer, a variable delay circuit and a divide-by-2 circuit. The multiplexer is configured to receive a selection signal and select one of a first clock signal and a second clock signal having opposite phases according to the selection signal to generate a frequency doubled clock signal that has a frequency that is twice of the frequency of the first clock signal and the second clock signal. The variable delay circuit is configured to delay the frequency doubled clock signal for a predetermined time to generate a delayed frequency doubled clock signal. The divide-by-2 circuit is configured to divide a frequency of the delayed frequency doubled clock signal to generate the selection signal. The duty cycle adjusting circuit includes an average voltage generation circuit and a comparison circuit. The average voltage generation circuit is configured to receive the frequency doubled clock signal to generate an average voltage value of the frequency doubled clock signal. The comparison circuit is configured to receive the average voltage value and a reference voltage to generate a control signal according to a comparison result of the average voltage value and the reference voltage to control a duty cycle of the frequency doubled clock signal.

Another aspect of the present invention is to provide a method that includes the steps outlined below. A selection signal is received and one of a first clock signal and a second clock signal having opposite phases is selected according to the selection signal to generate a frequency doubled clock signal that has a frequency that is twice of the frequency of the first clock signal and the second clock signal by a multiplexer of a frequency doubler circuit. The frequency doubled clock signal is delayed for a predetermined time to generate a delayed frequency doubled clock signal by a variable delay circuit of the frequency doubler circuit. A frequency of the delayed frequency doubled clock signal is divided to generate the selection signal by a divide-by-2 circuit of the frequency doubler circuit. The frequency doubled clock signal is received to generate an average voltage value of the frequency doubled clock signal by an average voltage generation circuit of a duty cycle adjusting circuit. The average voltage value and a reference voltage are received to generate a control signal according to a comparison result of the average voltage value and the reference voltage by a comparison circuit of the duty cycle adjusting circuit to control a delay time of the variable delay circuit and to further control a duty cycle of the frequency doubled clock signal.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
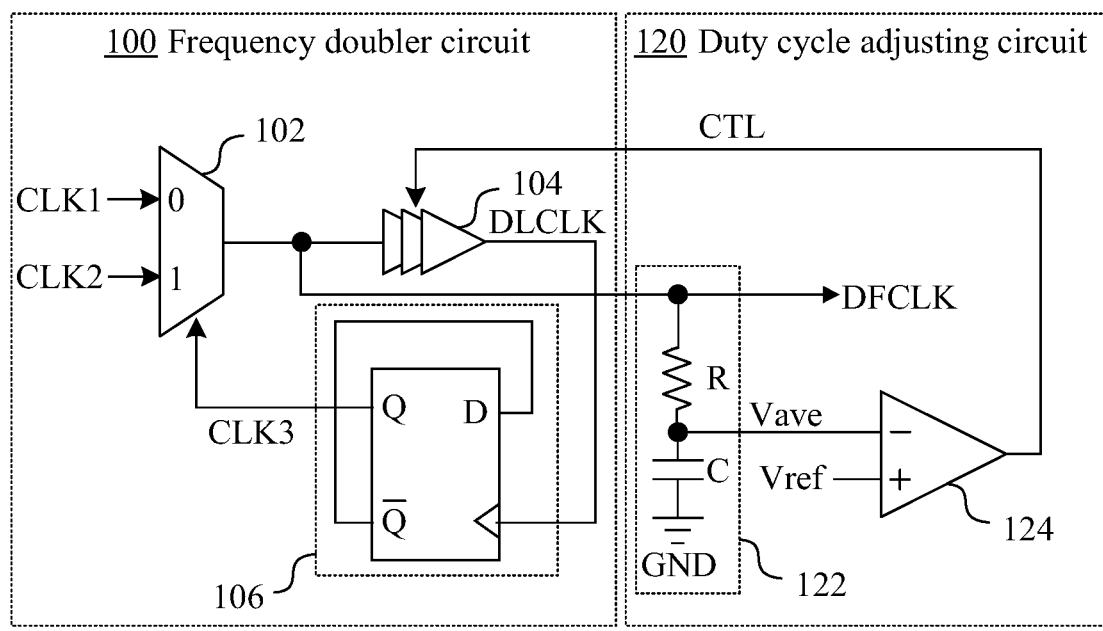
FIG. 1 is a block diagram of a frequency doubling apparatus in an embodiment of the present invention.

Reference is made to FIG. 1. FIG. 1 is a block diagram of a frequency doubling apparatus 1 in an embodiment of the present invention. The a frequency doubling apparatus 1 is configured to receive a clock signal, such as a first clock signal CLK1 and a second clock signal CLK2 and generate a frequency doubled clock signal DFCLK that has a frequency twice of the frequency of the first clock signal CLK1 and the second clock signal CLK2. The frequency doubling apparatus 1 includes a frequency doubler circuit 100 and a duty cycle adjusting circuit 120.

Figure 2:
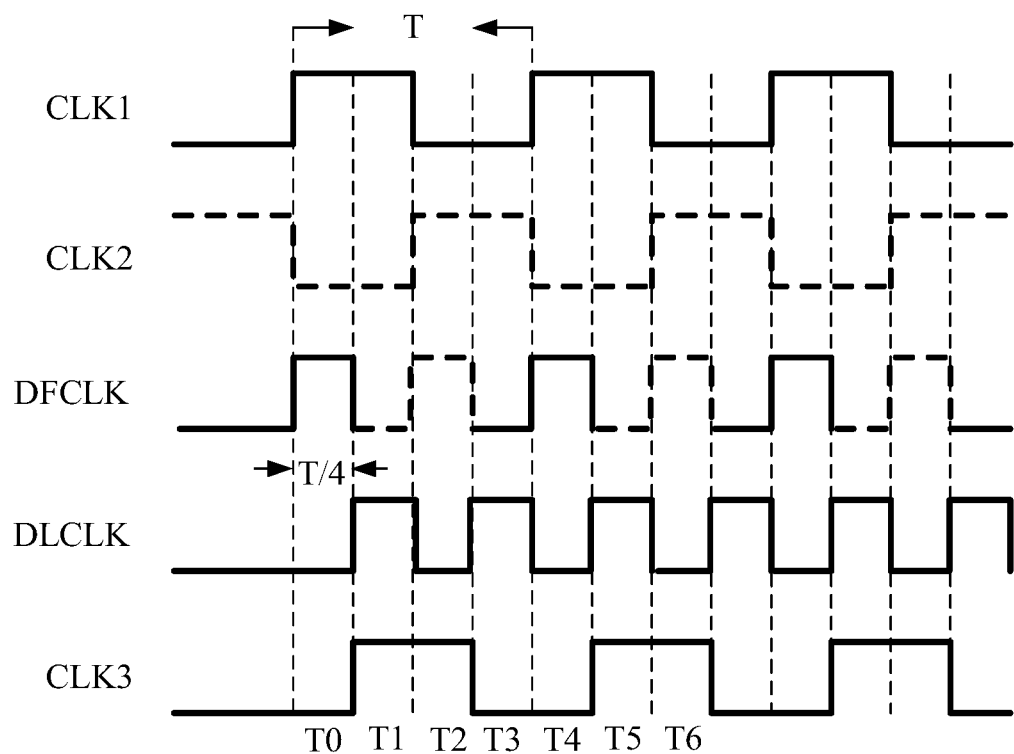
FIG. 2 is a diagram of waveforms of signals of the frequency doubling apparatus in an embodiment of the present invention.

Reference is now made to FIG. 2 at the same time. FIG. 2 is a diagram of waveforms of signals of the frequency doubling apparatus 1 in an embodiment of the present invention. The configuration and operation of the frequency doubling apparatus 1 are described in detail in accompany with FIG. 1 and FIG. 2.

The frequency doubler circuit 100 includes a multiplexer 102, a variable delay circuit 104 and a divide-by-2 circuit 106.

The multiplexer 102 is configured to receive a selection signal CLK3 and select one of the first clock signal CLK1 and the second clock signal CLK2 according to the selection signal CLK3 to generate a frequency doubled clock signal DFCLK that has a frequency that is twice of the frequency of the first clock signal CLK1 and the second clock signal CLK2. The first clock signal CLK1 and the second clock signal CLK2 have opposite phases. In FIG. 2, the first clock signal CLK1 is illustrated by a solid line and the second clock signal CLK2 is illustrated by a dashed line.

The variable delay circuit 104 is configured to delay the frequency doubled clock signal DFCLK for a predetermined time to generate a delayed frequency doubled clock signal DLCLK. In an embodiment, the period of both of the first clock signal CLK1 and the second clock signal CLK2 is T. The period of the frequency doubled clock signal DFCLK is T/2, and the predetermined time is T/4. As a result, the period of the delayed frequency doubled clock signal DLCLK is still T/2. However, the delayed frequency doubled clock signal DLCLK has a phase difference T/4 relative to the frequency doubled clock signal DFCLK.

In an embodiment, the divide-by-2 circuit 106 includes a data flip-flop having a negative feedback configuration. The technology of the data flip-flop and the negative feedback configuration that can be used to implement the function of division by 2 is well known to the skill of the art. As a result, the detail of the data flip-flip is not described herein. The divide-by-2 circuit 106 is configured to divide a frequency of the delayed frequency doubled clock signal DLCLK to generate the selection signal CLK3. As a result, relative to the delayed frequency doubled clock signal DLCLK, the period of the selection signal CLK3 is T.

As a result, during the time interval T0 illustrated in FIG. 2, since the selection signal CLK3 is at a low state, the multiplexer 102 in FIG. 1 selects the first clock signal CLK1 to be outputted. Under such a condition, the positive edge of the frequency doubled clock signal DFCLK in the time interval T0 is equivalent to the positive edge of the first clock signal CLK1. Further, in time interval T0, the frequency doubled clock signal DFCLK is illustrated as the solid line corresponding to the first clock signal CLK1.

In the time intervals T1 and T2 in FIG. 2, since the selection signal CLK3 is at a high state, the multiplexer 102 in FIG. 1 selects the second clock signal CLK2 to be outputted. Under such a condition, the positive edge of the frequency doubled clock signal DFCLK in the time intervals T1 and T2 is equivalent to the positive edge of the second clock signal CLK2. Further, in time intervals T1 and T2, the frequency doubled clock signal DFCLK is illustrated as the dashed line corresponding to the second clock signal CLK2.

Similarly, in the time intervals T3 and T4 in FIG. 2, since the selection signal CLK3 is at the low state, the multiplexer 102 in FIG. 1 selects the first clock signal CLK1 to be outputted. Under such a condition, the positive edge of the frequency doubled clock signal DFCLK in the time intervals T3 and T4. The negative edge of the frequency doubled clock signal DFCLK in the time intervals T3 and T4 is the signal transition caused by the switching of the multiplexer 102. Further, in time intervals T3 and T4, the frequency doubled clock signal DFCLK is illustrated as the solid line corresponding to the first clock signal CLK1.

In the time intervals T5 and T6 in FIG. 2, since the selection signal CLK3 is at a high state, the multiplexer 102 in FIG. 1 selects the second clock signal CLK2 to be outputted. Under such a condition, the positive edge of the frequency doubled clock signal DFCLK in the time intervals T5 and T6 is equivalent to the positive edge of the second clock signal CLK2. The negative edge of the frequency doubled clock signal DFCLK in the time intervals T5 and T6 is the signal transition caused by the switching of the multiplexer 102. Further, in time intervals T5 and T6, the frequency doubled clock signal DFCLK is illustrated as the dashed line corresponding to the second clock signal CLK2.

As a result, by using the mechanism described above, the frequency doubler circuit 100 can generate the frequency doubled clock signal DFCLK according to the first clock signal CLK1 and the second clock signal CLK2, in which the frequency of the frequency doubled clock signal DFCLK is twice of the frequency of the first clock signal CLK1 and the second clock signal CLK2.

The duty cycle adjusting circuit 120 includes an average voltage generation circuit 122 and a comparison circuit 124.

The average voltage generation circuit 122 is configured to receive the frequency doubled clock signal DFCLK to generate an average voltage value Vave of the frequency doubled clock signal DFCLK.

In an embodiment, the average voltage generation circuit 122 includes a resistor R and a capacitor C. The resistor R includes a first terminal configured to receive the frequency doubled clock signal DFCLK and a second terminal configured to generate the average voltage Vave of the frequency doubled clock signal DFCLK. The capacitor C is electrically coupled between the second terminal of the resistor R and a ground terminal GND. The resistor R and the capacitor C function together as an integration circuit to generate the average voltage Vave of the frequency doubled clock signal DFCLK. In an embodiment, when the duty cycle of the of the frequency doubled clock signal DFCLK is 50%, in which the durations of the high state and the low state of the of the frequency doubled clock signal DFCLK are the same, and when the high state voltage level is VDD, the average voltage Vave is VDD/2.

The comparison circuit 124 is configured to receive the average voltage value Vave and a reference voltage Vref to generate a control signal CTL according to a comparison result of the average voltage value Vave and the reference voltage Vref to control the duty cycle of the frequency doubled clock signal DFCLK.

In an embodiment, the reference voltage Vref is set to be VDD/2. A positive terminal of the comparison circuit 124 receives the reference voltage Vref, and a negative terminal of the comparison circuit 124 receives the average voltage value Vave. As a result, the condition that the average voltage value Vave is smaller than the reference voltage Vref indicates that the duty cycle of the frequency doubled clock signal DFCLK is smaller than 50%. The comparison circuit 124 can generate the control signal CTL to increase the delay time of the variable delay circuit 104 such that the delay time approaches T/4 (the half period of the delayed frequency doubled clock signal DLCLK) and the duty cycle approaches 50%.

On the contrary, the condition that the average voltage value Vave is larger than the reference voltage Vref indicates that the duty cycle of the frequency doubled clock signal DFCLK is larger than 50%. The comparison circuit 124 can generate the control signal CTL to decrease the delay time of the variable delay circuit 104 such that the delay time approaches T/4 (the half period of the delayed frequency doubled clock signal DLCLK) and the duty cycle approaches 50%.

As a result, by disposing the duty cycle adjusting circuit 120, the mechanism to stabilize the duty cycle of the frequency doubled clock signal DFCLK can be provided.

Further, when the reference voltage Vref changes, the duty cycle adjusting circuit 120 can generate the control signal CTL to adjust the duty cycle of the frequency doubled clock signal DFCLK. For example, when the reference voltage Vref is set to be VDD/4, the delay time can be set to be T/8 such that the duty cycle of the frequency doubled clock signal DFCLK is controlled to be 25%. When the reference voltage Vref is set to be (¾) VDD, the delay time can be set to be (⅜)T such that the duty cycle of the frequency doubled clock signal DFCLK is controlled to be 75%.

As a result, the relative relation between the amount of the reference voltage Vref and the high state voltage level determines the duty cycle of the frequency doubled clock signal DFCLK.

In conclusion, the frequency doubling apparatus 1 can use the frequency doubler circuit 100 with a simple circuit configuration to generate the frequency doubled clock signal DFCLK and use the duty cycle adjusting circuit 120 to control and adjust the duty cycle of the frequency doubled clock signal DFCLK with stability and accuracy.

In an embodiment, if the components in the frequency doubler circuit 100 receive power from external power module in operation, the frequency doubler circuit 100 is easily affected by the jitter of the high frequency of the power and is not able to be adjusted by the duty cycle adjusting circuit 120. In an embodiment, the comparison circuit 124 can be implemented by a low dropout regulator (LDO) circuit to generate the control signal CTL that is in the form of the voltage signal. The control signal CTL can be provided to the multiplexer 102 and the divide-by-2 circuit 106 such that the multiplexer 102 and the divide-by-2 circuit 106 operate according to the control signal CTL.

Under such a design, the frequency doubling apparatus 1 can provide the frequency doubler circuit 100 a voltage stabilizing mechanism without increasing additional area and cost of the stabilizing circuit. The frequency doubled clock signal DFCLK generated therefrom can more stable and accurate.

Further, in an embodiment, the frequency doubled clock signal DFCLK generated by the frequency doubling apparatus 1 of the present invention can be outputted to one or more than one frequency doubling circuits connected in series (such as but not limited to the circuits implemented also by the frequency doubling apparatus 1 or by other frequency doubling circuits) to generate the clock signals having the frequency of power of 2 (e.g. 4 times, 8 times and 16 times, etc).

Figure 3:
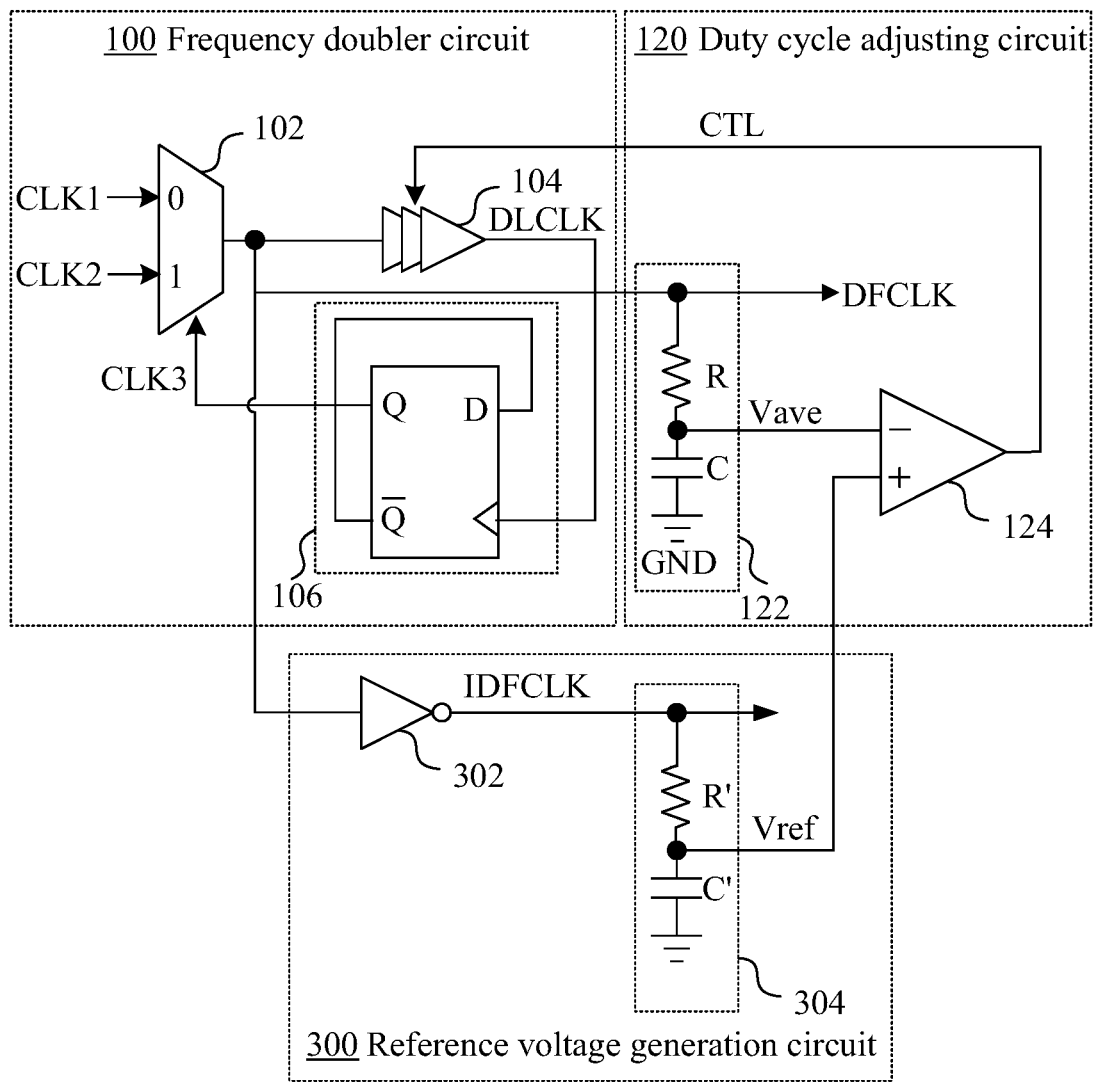
FIG. 3 is a block diagram of a frequency doubling apparatus in an embodiment of the present invention.

Reference is now made to FIG. 3. FIG. 3 is a block diagram of a frequency doubling apparatus 3 in an embodiment of the present invention. Similar to the frequency doubling apparatus 1 illustrated in FIG. 1, the frequency doubling apparatus 3 includes the frequency doubler circuit 100 and the duty cycle adjusting circuit 120. As a result, the identical components are not described herein. The difference between the frequency doubling apparatus 3 and the frequency doubling apparatus 1 in FIG. 1 is that the frequency doubling apparatus 3 further includes a reference voltage generation circuit 300.

The reference voltage generation circuit 300 includes an inverter 302 and a voltage generation circuit 304. The inverter 302 is configured to receive the frequency doubled clock signal DFCLK to generate an inverse frequency doubled clock signal IDFCLK. The configuration of the voltage generation circuit 304 is identical to the average voltage generation circuit 122 and includes a resistor R' and a capacitor C'. The voltage generation circuit 304 is configured to receive the inverse frequency doubled clock signal IDFCLK to generate an average voltage value of the inverse frequency doubled clock signal IDFCLK such that the average voltage value is fed to the comparison circuit 124 as the reference voltage Vref.

Under such a configuration, due to the characteristic that the phases of the frequency doubled clock signal DFCLK and the inverse frequency doubled clock signal IDFCLK are opposite, the average voltage value of the inverse frequency doubled clock signal IDFCLK can be used as the reference voltage Vref such that the duty cycle of the frequency doubled clock signal DFCLK can be adjusted to 50%. An additional reference voltage generation circuit is not required.

Figure 4:
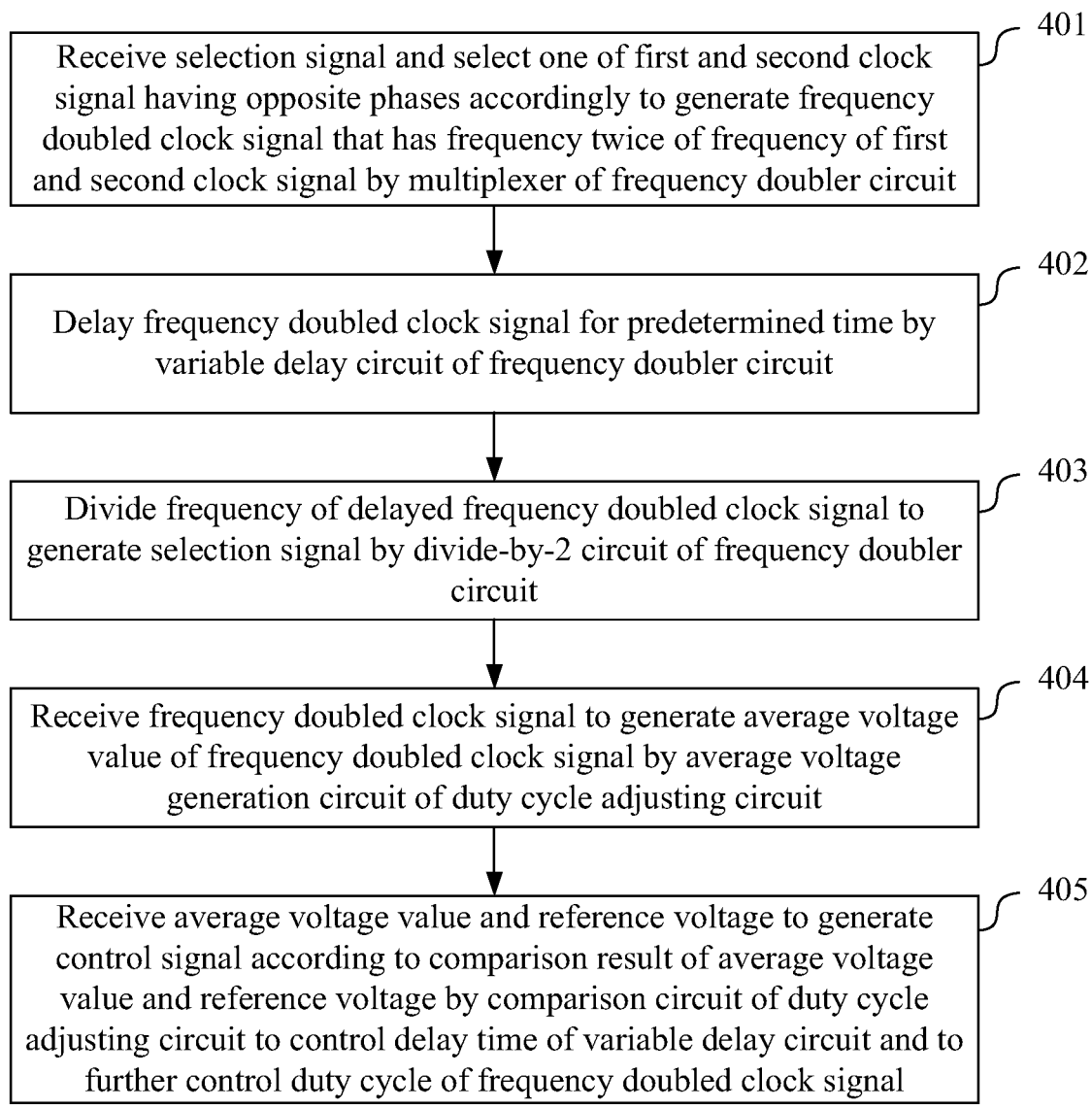
FIG. 4 is a flow chart of a frequency doubling method in an embodiment of the present invention.

Reference is now made to FIG. 4. FIG. 4 is a flow chart of a frequency doubling method 400 in an embodiment of the present invention. The frequency doubling method 400 can be used in the frequency doubling apparatus 1 illustrated in FIG. 1.

The frequency doubling method 400 includes the steps outlined below (The steps are not recited in the sequence in which the operations are performed. That is, unless the sequence of the steps is expressly indicated, the sequence of the operations is interchangeable, and all or part of the steps may be simultaneously, partially simultaneously, or sequentially performed).

In step 401, a selection signal CLK3 is received and one of the first clock signal CLK1 and the second clock signal CLK2 having opposite phases is selected according to the selection signal CLK3 to generate the frequency doubled clock signal DFCLK that has the frequency that is twice of the frequency of the first clock signal CLK1 and the second clock signal CLK2 by the multiplexer 102 of the frequency doubler circuit 100.

In step 402, the frequency doubled clock signal DFCLK is delayed for the predetermined time by the variable delay circuit 104 of the frequency doubler circuit 100.

In step 403, the frequency of the delayed frequency doubled clock signal DLCKL is divided to generate the selection signal CLK3 by the divide-by-2 circuit 106 of the frequency doubler circuit 100.

In step 404, the frequency doubled clock signal DFCLK is received to generate the average voltage value Vave of the frequency doubled clock signal DFCLK by the average voltage generation circuit 122 of the duty cycle adjusting circuit 120.

In step 405, the average voltage value Vave and the reference voltage Vref are received to generate the control signal CTL according to the comparison result of the average voltage value Vave and the reference voltage Vref by the comparison circuit 124 of the duty cycle adjusting circuit 120 to control the delay time of the variable delay circuit 104 and to further control the duty cycle of the frequency doubled clock signal DFCLK.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. An apparatus, comprising:
 a frequency doubler circuit including:
  a multiplexer configured to receive a selection signal and select one of a first clock signal and a second clock signal having opposite phases according to the selection signal to generate a frequency doubled clock signal that has a frequency that is twice of the frequency of the first clock signal and the second clock signal;
a variable delay circuit configured to delay the frequency doubled clock signal for a predetermined time to generate a delayed frequency doubled clock signal; and
a divide-by-2 circuit configured to divide a frequency of the delayed frequency doubled clock signal to generate the selection signal; and
a duty cycle adjusting circuit including:
an average voltage generation circuit configured to receive the frequency doubled clock signal to generate an average voltage value of the frequency doubled clock signal; and
a comparison circuit configured to receive the average voltage value and a reference voltage to generate a control signal according to a comparison result of the average voltage value and the reference voltage to control a delay time of the variable delay circuit and to further control a duty cycle of the frequency doubled clock signal.

2. The apparatus of claim 1, wherein the divide-by-2 circuit comprises a data flip-flop having a negative feedback configuration.

3. The apparatus of claim 1, wherein four consecutive positive edges comprising a first positive edge, a second positive edge, a second positive edge, a third positive edge and a fourth positive edge of the frequency doubled clock signal are generated by selecting a first clock signal positive edge of the first clock signal, a first clock signal positive edge of the second clock signal, a second clock signal positive edge of the first clock signal after the first clock signal positive edge of the first clock signal and a second clock signal positive edge of the second clock signal after the first clock signal positive edge of the second clock signal by the multiplexer.

4. The apparatus of claim 1, wherein the average voltage generation circuit comprises:
a resistor comprising a first terminal configured to receive the frequency doubled clock signal and a second terminal configured to generate the average voltage; and
a capacitor electrically coupled between the second terminal and a ground terminal.

5. The apparatus of claim 1, wherein the control signal is a voltage signal and the voltage signal is further transmitted to the multiplexer and the divide-by-2 circuit such that the multiplexer and the divide-by-2 circuit operate according to the voltage signal.

6. The apparatus of claim 1, wherein the frequency doubled clock signal has a high state voltage level, and a relative relation between the amount of the reference voltage and the high state voltage level determines the duty cycle of the frequency doubled clock signal.

7. The apparatus of claim 6, wherein when the duty cycle of the first clock signal and the second clock signal is 50% and when the reference voltage is the half of the high state voltage level, the control signal controls the delay time of the variable delay circuit to be a half period of the frequency doubled clock signal such that the duty cycle of the frequency doubled clock signal is 50%.

8. A method, comprising:
receiving a selection signal and select one of a first clock signal and a second clock signal having opposite phases according to the selection signal to generate a frequency doubled clock signal that has a frequency that is twice of the frequency of the first clock signal and the second clock signal by a multiplexer of a frequency doubler circuit;
delaying the frequency doubled clock signal for a predetermined time to generate a delayed frequency doubled clock signal by a variable delay circuit of the frequency doubler circuit;
dividing a frequency of the delayed frequency doubled clock signal to generate the selection signal by a divide-by-2 circuit of the frequency doubler circuit;
receiving the frequency doubled clock signal to generate an average voltage value of the frequency doubled clock signal by an average voltage generation circuit of a duty cycle adjusting circuit; and
receiving the average voltage value and a reference voltage to generate a control signal according to a comparison result of the average voltage value and the reference voltage by a comparison circuit of the duty cycle adjusting circuit to control a delay time of the variable delay circuit and to further control a duty cycle of the frequency doubled clock signal.

9. The method of claim 8, wherein four consecutive positive edges comprising a first positive edge, a second positive edge, a second positive edge, a third positive edge and a fourth positive edge of the frequency doubled clock signal are generated by selecting a first clock signal positive edge of the first clock signal, a first clock signal positive edge of the second clock signal, a second clock signal positive edge of the first clock signal after the first clock signal positive edge of the first clock signal and a second clock signal positive edge of the second clock signal after the first clock signal positive edge of the second clock signal by the multiplexer.

10. The method of claim 8, wherein the frequency doubled clock signal has a high state voltage level, and a relative relation between the amount of the reference voltage and the high state voltage level determines the duty cycle of the frequency doubled clock signal.

11. An apparatus, comprising:
a frequency doubler circuit including:
a multiplexer configured to receive a selection signal and select one of a first clock signal and a second clock signal having opposite phases according to the selection signal to generate a frequency doubled clock signal that has a frequency that is twice of the frequency of the first clock signal and the second clock signal;
a variable delay circuit configured to delay the frequency doubled clock signal for a predetermined time; and
a divide-by-2 circuit configured to divide a frequency of the delayed frequency doubled clock signal to generate the selection signal; and
a duty cycle adjusting circuit including:
a first average voltage generation circuit configured to receive the frequency doubled clock signal to generate a first average voltage value of the frequency doubled clock signal;
a second average voltage generation circuit configured to receive an inverse frequency doubled clock signal that has a phase opposite to the frequency doubled clock signal to generate a second average voltage value of the inverse frequency doubled clock signal as a reference voltage; and
a comparison circuit configured to receive the first average voltage value and the reference voltage to generate a control signal according to a comparison result of the first average voltage value and the reference voltage to control a delay time of the variable delay circuit and to further control a duty cycle of the frequency doubled clock signal.

* * * * *